United States Patent [19]
Nishioka

[11] 4,431,967
[45] Feb. 14, 1984

[54] METHOD OF MOUNTING A SEMICONDUCTOR ELEMENT FOR ANALYZING FAILURES THEREON

[75] Inventor: Tadashi Nishioka, Itami, Japan

[73] Assignee: Mitsubishi Denki Kabushiki Kaisha, Tokyo, Japan

[21] Appl. No.: 180,011

[22] Filed: Aug. 21, 1980

[30] Foreign Application Priority Data

Aug. 28, 1979 [JP] Japan .................. 54-110085

[51] Int. Cl.³ .................................... G01R 31/22
[52] U.S. Cl. .................. 324/158 R; 324/96; 324/158 D
[58] Field of Search .......... 324/158 R, 158 D, 96, 324/73 R, 72; 357/9

[56] References Cited

U.S. PATENT DOCUMENTS

Re. 13,798  9/1914  Pickard .................. 357/9

OTHER PUBLICATIONS

Keen; J. M., "Nondestructive Optical...;" Electronics Letters; Jul. 29, 1979; vol. 7; No. 15; pp. 432-433.
Salvo; C. J.; "A Improved Approach...;" 14th Annual Proc., Reliability Physics 1976; Apr. 20-22, 1976; pp. 263-274.
Heilmeier et al.; "Dynamic Scattering...;" Proc. of the IEEE; vol. 56; No. 7; 1968; pp. 1162-1171.

Primary Examiner—Ernest F. Karlsen
Attorney, Agent, or Firm—Wenderoth, Lind & Ponack

[57] ABSTRACT

A semiconductor chip having its main face coated with an electrically insulating film is encapsulated in a plastic, electrically conducting member disposed on a metallic plate so that the surface of the insulating member is exposed and parallel to the metallic plate. The surface of the insulating film is observed by an optical microscope through a nematic liquid crystal film and a glass slide with a transparent, electrically conducting coating successively disposed on the chip with a DC voltage applied between the conducting coating and the metallic plate.

1 Claim, 7 Drawing Figures

METHOD OF MOUNTING A SEMICONDUCTOR ELEMENT FOR ANALYZING FAILURES THEREON

BACKGROUND OF THE INVENTION

This invention relates to a method of mounting a semiconductor element for analyzing failures thereon.

In order to improve the yield and reliability of semiconductor elements, failure analyses and extremely important in locating defects on the semiconductor elements and in defining the causes for those defects. There have been previously porposed various approaches to analyze failures on semiconductor elements. One of such approaches is to utilize the dynamic scattering effect exhibited by nematic liquid crystals. The utilization of the dynamic scattering effect has numerous advantages including simplicity, high sensitivity, etc. and it therefore has been admiringly employed in recent years.

Methods utilizing the dynamic scattering effect of nematic liquid crystals first dispose the nematic liquid crystal in the form of a film on the main face of the particular semiconductor chip including the semiconductor elements to be analyzed, and then dispose a glass slide with a transparent, electrically conducting coating on the film-shaped nematic liquid crystal and then apply a DC voltage across the semiconductor chip and the electrically conducting coating. If the entire surface of the semiconductor chip is coated with an electrically insulating film, including a pinhole defect or defects, then that defect or each defect is operative to increase a potential of that portion of the film-shaped liquid crystal facing the same relative to the semiconductor chip and the dynamic scattering effect is developed on such a portion of the film-shaped liquid crystal. That is, external light incident upon that portion of the liquid crystal is scattered. Under these circumstances, an optical microscope can be used to locate the pinhole defect or defects.

The methods as described above have previously comprised the steps of: cutting off lengths of bonding wire connected to the semiconductor chip which is accommodated in an associated package, taking out the semiconductor chip from the package, then disposing or fixing the semiconductor chip on or to a metallic plate, and disposing an electrically insulating spacer with an opening on the semiconductor chip. The electrically insulating spacer serves to maintain the semiconductor chip electrically insulated from an electrically conducting film as will be described hereinafter while at the same time keeping a uniform, constant thickness of a film of a nematic liquid crystal subsequently dropped on the semiconductor chip through the opening on the electrically insulating film. The opening on the electrically insulating film has been somewhat smaller in dimension than the semiconductor chip. That portion of the main face of the semiconductor chip facing the opening forms an object region in which failures are analyzed.

After the formation of the film of the nematic liquid crystal on the main face of the semiconductor chip within the opening on the electrically insulating spacer, a glass slide with a transparent, electrically conducting coating has been disposed on the spacer so that the electrically conducting coating contacts the nematic liquid crystal. In this way, the semiconductor chip or an analyzed sample has been disposed after which the extent of the dynamic scattering effect which is developed in the nematic liquid crystal is examined with a DC voltage applied between the electrically conducting coating on the glass slide and the metallic plate.

Conventional methods such as described above have been disadvantageous in the following respects:

(i) Since the opening on the electrically insulating spacer is smaller in dimension than the semiconductor chip, the analysis can not be effected throughout the main face of the semiconductor chip. If the opening on the electrically insulating spacer has a dimension equal to or greater than that of the semiconductor chip then the latter is located within the opening. Therefore, it is difficult to render the thickness of the film-shaped nematic liquid crystal and maintain the electrical insulation between the electrically conducting coating and the semiconductor chip;

(ii) it is difficult to perform the operation of the positioning the electrically insulating spacer on the main face of the semiconductor chip for the following reasons. The semiconductor chip is as small as a few millimeters square while the opening on the electrically insulating spacer is nearly equal in dimension to the semiconductor chip and therefore small. Also, the electrically insulating spacer is formed of a thin film such as a polyethylene film having a thickness on the order of ten $\mu$m and is extremely light. As a result, if the electrically insulating spacer would have been able to be disposed on the semiconductor chip so that the opening is located on the main face of the semiconductor chip within the entire area, then the spacer might be frequently displaced from its predetermined position due to the flowing of the air and/or the nematic liquid crystal occurring after the disposition of the spacer on the semiconductor chip. In addition, the electrically insulating spacer itself is difficult to handle;

(iii) when the semiconductor chip which has been separated from the associated package has been disposed on or fixed to the metallic plate, it is difficult to cause a direction normal to the main face of the semiconductor chip to coincide with the optical axis of an optical microscope through which the main face of the semiconductor chip is observed. This is because the semiconductor chip separated from the package includes the rear face having, in many cases, a brazing agent or the like fused thereto and therefore forming an even surface and not parallel to the main chip face. Accordingly, with the semiconductor chip merely disposed on or fixed to the metallic plate, the main face thereof forms, in many cases, an angle other than a right angle with the optical axis of an optical microscope involved. Under these circumstances, the use of an optical microscope with a high magnification results in the formation of an observation field having the focus not uniform over the entire area thereof. This means that the dynamic scattering effect of the liquid crystal is difficult to be detected.

Accordingly it is an object of the present invention to provide a new and improved method of analyzing failures on a semiconductor element through the utilization of the dynamic scattering effect of a nematic liquid crystal which method is free from the disadvantages of the prior art practice as described above.

SUMMARY OF THE INVENTION

The present invention provides a method of mounting a semiconductor element for analyzing failures thereon by applying to the sample to be analyzed a nematic liquid crystal and using the dynamic scattering effect thereof; the method comprises the step of exposing a main face of a semiconductor chip including semiconductor elements and burying the remaining portion of the semiconductor chip in an electrically conducting member so as to be in intimate contact with the electrically conducting member.

BRIEF DESCRIPTION OF THE DRAWINGS

The present invention will become more readily apparent from the following detailed description taken in conjunction with the accompanying drawings in which:

FIG. 2b is a longitudinal sectional view illustrating the arrangement formed in the burying step shown in FIG. 2a.

Throughout the drawing figures, like reference numerals designate the identical components.

DESCRIPTION OF THE PREFERRED EMBODIMENT

Figure 1A:
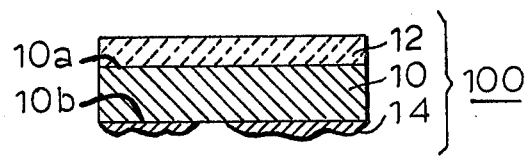
FIGS. 1a through 1e are longitudinal sectional views of a semiconductor chip illustrated in the order of the processing steps of one embodiment according to the failure analysis method of the present invention.

Referring now to FIG. 1a of the drawings, there is illustrated a semiconductor chip including semiconductor elements (not shown). The semiconductor chip is generally designated by the reference numeral 100 and prepared by cutting off lengths of bonding wire from an analyzed sample accommodated in an associated package, taking out the sample from the package, and melting a brazing agent attached to the sample by heating. Thereafter, the sample is picked out from a die pad therefor.

The semiconductor chip 100 thus prepared or the arrangement illustrated comprises a semiconductor substrate 10, as the main structural component, including a pair of opposite main faces 10a and 10b, an electrically insulating film 12 disposed on one of the main faces, in this case, the upper main faces as viewed in FIG. 1a of the semiconductor substrate 10, and a brazing agent 14 remaining on the other or lower main face 10b thereof. The semiconductor substrate 10 actually includes numerous transistors, semiconductor diodes, etc. made up on the upper main face 10a thereof; but, in order to facilitate the understanding of the present invention, it is assumed that only the electrically insulating film 12 is formed on the upper main face 10a of the semiconductor substrate 10.

Then, the semiconductor chip 100 is buried, in an electrically conducting member 16 disposed on a metallic plate 18 so that the main face 100a of the chip 100 is exposed and flush with the surface of the electrically conductive member 16 and the remaining portion of the chip 100 is in the electrically conducting member 16. The main chip face 100a coincides with the surface of the electrically insulating film 12. The electrically conductive member 16 is of any suitable electrically conductive material which is relatively low in its electric resistivity and relatively high in its plasticity. The conducting member 16 is in intimate contact with both the brazing agent 14 remaining on the lower main face 10b of the semiconductor substrate 10 and the metallic plate 18. Therefore, the member 16, agent 14, and plate 18 are in an electrically conducting relationship with each other.

Figure 1B:
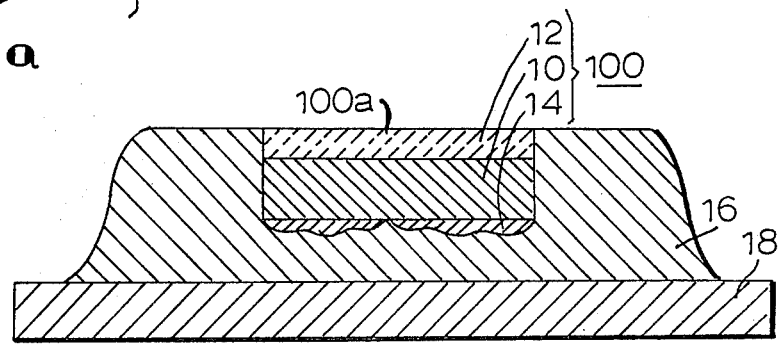
Figure 1C:
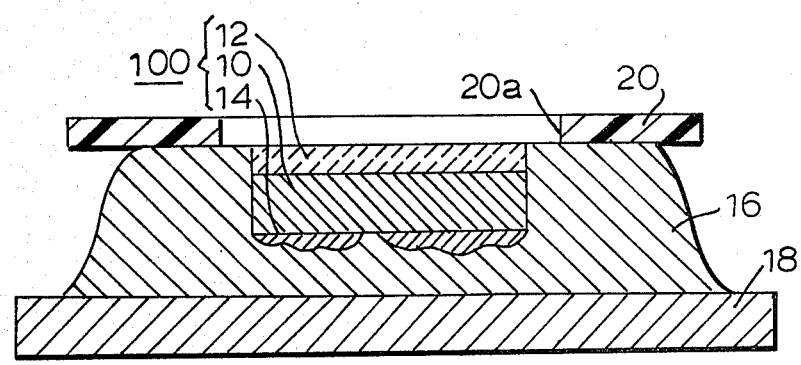

Subsequently, an electrically insulating spacer 20 with an opening 20a is formed of a thin film, for example, a thin polyethylene film and is disposed on the electrically conductive member 16 with the main face 100a of the semiconductor chip 100 or the surface of the electrically insulating film 12 located within the opening 20a as shown in FIG. 1c.

Following this, a film of a nematic liquid crystal 22 is disposed in the opening 20a on the electrically insulating spacer 20. To this end, the nematic liquid crystal is dropped in a measured amount within the opening 20a and then a piece of sheet glass or a glass slide with a transparent electrically conducting coating is disposed on the electrically insulating spacer 20 as will be subsequently described.

Figure 1D:
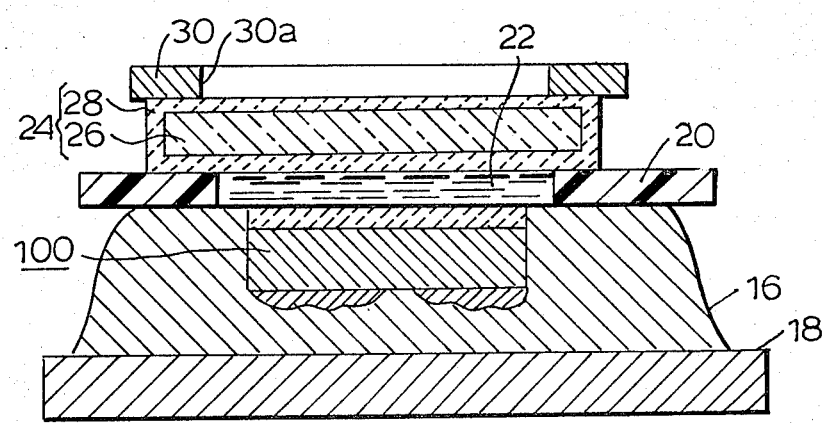

As shown in FIG. 1d, the glass slide is generally designated by the reference numeral 24 and includes the main body 26 having the entire surface covered with a coating of a transparent, electrically conductive material 28 such as tin oxide ($SnO_2$), indium oxide ($In_2O_3$) or the like. This glass slide 24 is disposed on the electrically insulating spacer 20 so that the transparent, electrically conductive coating 28 is contacted by the nematic liquid crystal. The nematic liquid crystal is thereby spread into the film 22 thereof by means of the action of the weight of the glass slide 24.

If desired, the transparent electrically conducting coating 28 may be disposed on one of the opposite surfaces of the glass slide 24. In this case it will readily be understood that the glass slide 24 is disposed on the electrically insulating spacer 20 so that the electrically conducting coating 28 contacts the nematic liquid crystal 22.

Then, an apertured electrode 30 is disposed on the glass slide 24. The electrode 30 includes an opening 30a not smaller in dimension than the opening 20a on the spacer 20 so that, with the spacer 20 overlaid with the electrode 30, the opening 20a is entirely located below the opening 30a.

The resulting structure is shown in FIG. 1d, and as seen in FIG. 1d, the main face 100a of the semiconductor chip 100 or the surface of the electrically insulating film 20 can be visually observed from the opening 30a on the electrode 30 through the glass slide 24 with the transparent electrically conductive coating 28 and the film of the nematic liquid crystal 22.

Figure 1E:
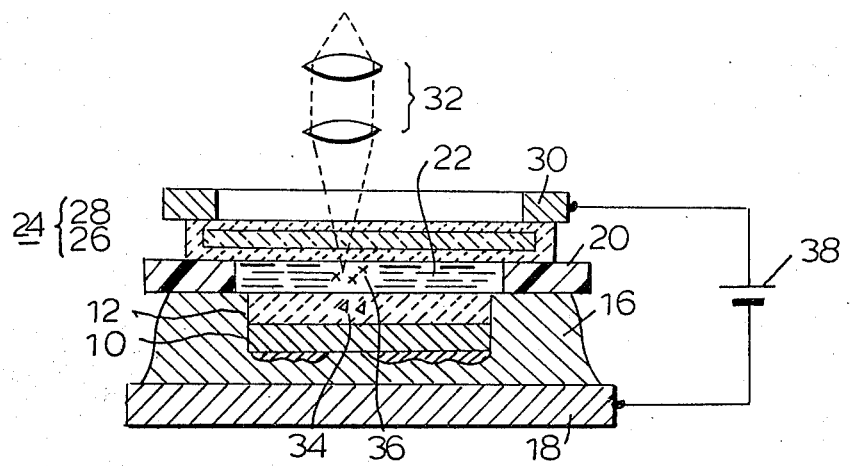

Under these circumstances, a DC voltage is applied between the apertured electrode 30 and the metallic plate 18 while the main surface 100a of the semiconductor chip 100 is observed through an optical microscope 32 which is shown in FIG. 1e as a pair of spaced aligned lenses and via the glass slide 24 with the transparent, electrically conductive coating 28 and the film of the nematic liquid crystal 22 as shown in FIG. 1e.

Since the electrode 30 contacts a portion of the transparent, electrically conductive coating 28 on the glass slide 24, the DC voltage is applied across the transparent, electrically conductive coating 28 and the semiconductor substrate 10. That is, the DC voltage is applied across the transparent, conducting coating 28 and the interface between the electrically insulating film 12 and the film of the nematic liquid crystal 22. If the electrically insulating film 12 disposed on the upper main face 10a of the semiconductor substrate 10 includes defects 34 such as pinholes then the dynamic scattering effect is developed within the film of the nematic liquid crystal 22 as shown at the symbol "cross" in FIG. 1d. Therefore, positions 36 where the dynamic scattering effect has been developed can be detected under the irradiation with external light by the microscope 32. This results in the location of the defects 34.

Figure 2A:
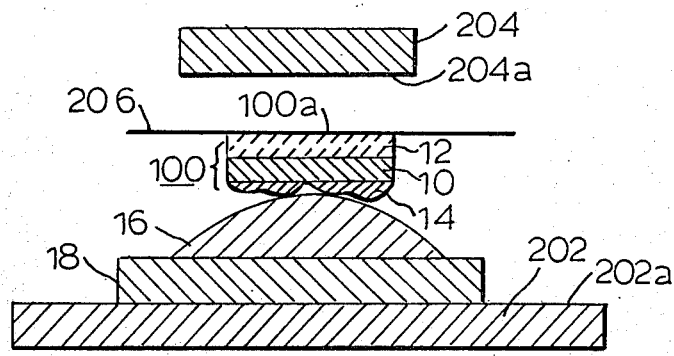
FIG. 2a is a longitudinal sectional view illustrating the step of burying the semiconductor chip in the electrically conducting member as shown in FIG. 1b.

FIG. 2a illustrates the step of burying the semiconductor chip 10 in the electrically conducting member 16 as shown in FIG. 1b. The arrangement illustrated comprises a parallel plane former which is principally composed of a lower pedestal 202 and an upper plate 204 movable toward and away from the lower pedestal 202 while the parallel relationship is maintained between the opposite surfaces of the lower pedestal and upper plate 202 and 204 respectively.

The electrically conducting member 16 is formed to be crowned and disposed on the metal plate 18. Then, the semiconductor chip 100 is laid on the crowned member 16 so that the lower surface of the chip 100 contacts the crowned surface of the electrically conducting member 16 and simultaneously the main face 100a of the chip 100 or the surface of the electrically insulating film is substantially parallel to the metallic plate 18. The assembly thus prepared is disposed on the lower pedestal 202 of the parallel plane former 200 and a piece of an interposing sheet 206 is disposed on the assembly so that it can fully cover the semiconductor chip 100 and the electrically conductive member 16. The interposing sheet 206 is formed of any suitable material capable of intimately contacting the semiconductor chip 100 and the electrically conducting member 16 and then being peeled off from both the chip and conducting member 100 and 16 respectively without the two being deformed and displaced. For example, such a sheet may be formed of a polyethylene film.

Subsequently, the upper plate 204 is lowered and pressure is applied across the upper plate 204 and pedestal 202 to thereby bury the semiconductor chip 100 in the electrically conducting member 16. Thereafter, the upper plate 204 is raised and the piece of the interposing sheet 206 is peeled from the pressed conductive member 16.

Figure 2B:
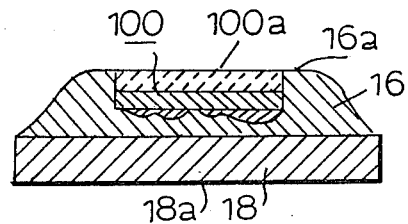

The resulting structure is shown in FIG. 2b and also in FIG. 1b. As shown the main face 100a of the semiconductor chip 100 is exposed and flush and the surface 16a of the electrically conducting member 16 is rendered flat by the upper plate 204. The main chip surface 100a and the surface of the electrically conducting member 16 is accurately parallel to that surface, in this case, the lower surface 18a as viewed in FIG. 2b of the metallic plate 18.

Following this, the arrangement of FIG. 2b is processed as described above in conjunction with FIGS. 1c through 1e.

The electrically conductive member 14 is formed preferably of a compound used in a vacuum and including a multitude of finely divided particles of a metallic material such as silver dispersed therein. Since only extremely minute currents flow through those portions of the nematic liquid crystal on which the dynamic scattering effect is developed, the electrically conducting member 16 is preferably low in its electric resistivity but it is rather better to form the electrically conducting member 16 of a material selected in view of the plasticity thereof rather than of the electric resistance thereof and still having the property that it is difficult to be dissolved in an associated nematic liquid crystal.

The present invention has several advantages, for example, since the semiconductor chip 100 includes the main face 100a flush with the surface 16a of the electrically conducting member 16, there is no fear that, with the opening 20a on the electrically insulating spacer 20 greater in dimension than the semiconductor chip 100, the transparent, electrically conducting coating 28 contacts the semiconductor chip 100 to permit a flow of leakage current therethrough which is detrimental to the failure analysis. Also, the film of the nematic liquid crystal 22 is free from non-uniformity whereby the semiconductor chip 100 can be observed and analyzed throughout the surface area thereof.

Also, as the opening 20a on the electrically insulating spacer 20 may be somewhat greater in dimension than the semiconductor chip 100, the spacer 20 can be easily disposed in place on the chip 100.

Furthermore, since the main chip surface 100a is parallel to the rear surface 18a of the metallic plate 18, the optical microscope 32 has the optical axis accurately normal to those surfaces. Therefore, when the optical microscope 22 has a high magnification minute dynamic scattering positions 36 developed in an associated liquid crystal, that is, minute defects 34 on the chip 100, can be located over a wide field of vision thereof with a uniform high detection sensitivity and without any unfocussed portion occurring in the field of vision. Under these circumstances, the dynamic scattering effect of the liquid crystal is incidentally exhibited on that portion of the nematic liquid crystal film 22 contacting the electrically conducting member 16. However, such an effect does not impede the failure analysis because such an effect occurs externally of the semiconductor chip 100 and therefore positions where this incidental dynamic scattering effect is developed can readily be distinguished from the positions 36 where the dynamic scattering effect is developed due to the true defects 32.

From the foregoing it is seen that, according to the present invention, the method of analyzing failures on a semiconductor elements uses an analyzed sample prepared by taking out a small semiconductor chip from an associated package and burying it in an electrically conducting member excepting that the main face thereof is exposed. Therefore, the present invention can detect minute defects on the semiconductor chip throughout the enter area of the main face thereof with a uniform high sensitivity. This can, in turn, improve manufacturing techniques capable of expecting the production of semiconductor elements high in reliability with a high yield.

While the present invention has been illustrated and described in conjunction with a single preferred embodiment thereof, it is to be understood that numerous changes and modifications may be resorted to without departing from the spirit and scope of the present invention.

What is claimed is:
1. A method which comprises the steps of:
inserting a semiconductor chip including a semiconductor element disposed on a main surface of the semiconductor chip into an electrically conducting member from an upper surface thereof so as to leave said main surface of said semiconductor chip exposed while at least one portion of a surface which is opposite to the main surface and lateral surfaces of said semiconductor chip are in intimate contact with said electrically conducting member;

disposing an electrically insulating spacer including an opening on the upper surface of said electrically conducting member so as to cause said opening to be opposite to the main surface of said semiconductor chip;

forming a film of a nematic liquid crystal in said opening so as to be intimate contact with the main surface of said semiconductor chip;

placing a transparent plate having a transparent electrically conducting film disposed on at least one surface thereof on said electrically insulating spacer so that said transparent electrically conducting film is in contact with said nematic liquid crystal film; and applying a DC voltage across said electrically conducting member and said transparent electrically conducting film, wherein failures on said semiconductor chip are analyzed by using a dynamic scattering effect of said nematic liquid crystal film.

* * * * *